United States Patent
Yokou et al.

(10) Patent No.: US 8,390,318 B2
(45) Date of Patent: Mar. 5, 2013

(54) SEMICONDUCTOR DEVICE HAVING CALIBRATION CIRCUIT FOR ADJUSTING OUTPUT IMPEDANCE OF OUTPUT BUFFER CIRCUIT

(75) Inventors: Hideyuki Yokou, Tokyo (JP); Takanori Eguchi, Tokyo (JP); Manabu Ishimatsu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/401,052

(22) Filed: Feb. 21, 2012

(65) Prior Publication Data

US 2012/0212254 A1    Aug. 23, 2012

(30) Foreign Application Priority Data

Feb. 22, 2011    (JP) ................... 2011-035683

(51) Int. Cl.
*H03K 17/16*    (2006.01)
(52) U.S. Cl. ................. 326/30; 326/27; 326/82
(58) Field of Classification Search ............ 326/21, 326/26, 30, 82, 83, 87
See application file for complete search history.

(56) References Cited

U.S. PATENT DOCUMENTS

| | | | |
|---|---|---|---|
| 7,164,287 B2 | 1/2007 | Ueno | |
| 7,215,128 B2 | 5/2007 | Fujisawa | |
| 7,495,453 B2 | 2/2009 | Fujisawa | |
| 7,619,439 B2 * | 11/2009 | Suenaga | 326/30 |
| 7,808,270 B2 | 10/2010 | Fujisawa | |
| 2005/0110516 A1 | 5/2005 | Ueno | |
| 2006/0158198 A1 | 7/2006 | Fujisawa | |
| 2007/0194798 A1 | 8/2007 | Fujisawa | |
| 2008/0088338 A1 * | 4/2008 | Kim | 326/30 |
| 2009/0146756 A1 | 6/2009 | Fujisawa | |
| 2011/0001511 A1 | 1/2011 | Fujisawa | |
| 2012/0056641 A1 * | 3/2012 | Kuroki et al. | 326/30 |
| 2012/0092039 A1 * | 4/2012 | Lee | 326/30 |
| 2012/0146687 A1 * | 6/2012 | Kim | 326/30 |

FOREIGN PATENT DOCUMENTS

| | | | |
|---|---|---|---|
| JP | 2002-152032 A | 5/2002 |
| JP | 2004-032070 A | 1/2004 |
| JP | 2005-159702 A | 6/2005 |
| JP | 2006-203405 A | 8/2006 |

* cited by examiner

*Primary Examiner* — Don Le
(74) *Attorney, Agent, or Firm* — McGinn IP Law Group, PLLC (57) ABSTRACT

Disclosed herein is a device that includes a replica buffer circuit that drives a calibration terminal, a reference-potential generating circuit that generates a reference potential, a comparison circuit that compares a potential appearing at the calibration terminal with the reference potential, and a control circuit that changes an output impedance of the replica buffer circuit based on a result of a comparison by the comparison circuit. The reference-potential generating circuit includes a first potential generating unit activated in response to an enable signal and a second potential generating unit activated regardless of the enable signal, and an output node of the first potential generating unit and an output node of the second potential generating unit are commonly connected to the comparison circuit.

12 Claims, 7 Drawing Sheets

SEMICONDUCTOR DEVICE HAVING CALIBRATION CIRCUIT FOR ADJUSTING OUTPUT IMPEDANCE OF OUTPUT BUFFER CIRCUIT

BACKGROUND OF THE INVENTION

1. Field of the Invention

The present invention relates to a semiconductor device and, more particularly relates to a semiconductor device including a calibration circuit for adjusting an output impedance of an output buffer circuit.

2. Description of Related Art

In recent years, a data transfer between semiconductor devices (such as between a CPU and a memory device) requires a very high data-transfer rate. To achieve this, an amplitude of an input/output signal is made increasingly smaller. When an input/output signal has a small amplitude, the required precision of an impedance of an output buffer circuit becomes very severe.

The impedance of an output buffer circuit not only fluctuates according to a processing condition at a time of manufacturing but also is influenced by an ambient temperature and a fluctuation of a power source voltage when the output buffer circuit is actually used. Therefore, when the output buffer circuit is required to have a high precision of an impedance, an output buffer circuit having an impedance adjusting function is employed. An impedance of such an output buffer circuit is generally adjusted by using an output-impedance adjusting circuit called "calibration circuit". See Japanese Patent Application Laid-open Nos. 2002-152032, 2004-32070, 2006-203405 and 2005-159702.

As described in Japanese Patent Application Laid-open Nos. 2006-203405 and 2005-159702, a calibration circuit includes a replica buffer circuit having the same configuration as that of an output buffer circuit. When a calibration operation is performed, a potential appearing at a calibration terminal is compared with a reference potential in a state where an external resistor is connected to the calibration terminal, thereby adjusting an impedance of the replica buffer circuit. Adjustment details on the replica buffer circuit are then reflected on the output buffer circuit to adjust an impedance of the output buffer circuit to a desired value.

A calibration circuit includes a reference-potential generating circuit that generates a reference potential. Because the reference-potential generating circuit includes a plurality of resistive elements connected in series, a current continuously flows therethrough during generation of the reference potential. However, because a calibration operation using the calibration circuit is an intermittent operation which is not always performed but is performed each time a calibration command is issued, the power consumption by the reference-potential generating circuit can be reduced if the reference-potential generating circuit is also activated in response to the calibration command.

In the method of activating the reference-potential generating circuit in response to the calibration command, however, it takes a certain amount of time from when the reference-potential generating circuit is activated until when an appropriate reference potential is generated. Besides, this time varies according to chips, and in some chips, a comparison operation by a comparison circuit is started before an appropriate reference potential is generated. In such a case, the impedance of the replica buffer circuit is set to an inappropriate value.

SUMMARY

In one embodiment, there is provided a semiconductor device that includes: a calibration terminal; a replica buffer circuit that drives the calibration terminal; a reference-potential generating circuit that generates a reference potential; a comparison circuit, that compares a potential appearing at the calibration terminal with the reference potential to generate a comparison result signal; and a control circuit that controls an output impedance of the replica buffer circuit based on the comparison result signal. The reference-potential generating circuit includes a first potential generating unit activated in response to an enable signal and a second potential generating unit activated regardless of the enable signal, and an output node of the first potential generating unit and an output node of the second potential generating unit are commonly coupled to the comparison circuit.

In another embodiment, there is provided a semiconductor device that includes: a first potential generating unit that outputs a first potential at a first output node thereof when an enable signal is in a first logic level, the first potential generating unit bringing the first output node into a high-impedance state when an enable signal is in a second logic level different from the first logic level; a second potential generating unit that outputs the first potential at a second output node thereof when at least the enable signal is in the second logic level; a connection line that electrically connects the first and second output nodes; and a comparison circuit that compares the first potential appearing at the connection line with a second potential.

DETAILED DESCRIPTION OF THE EMBODIMENTS

Preferred embodiments of the present invention will be explained below in detail with reference to the accompanying drawings.

Figure 1:
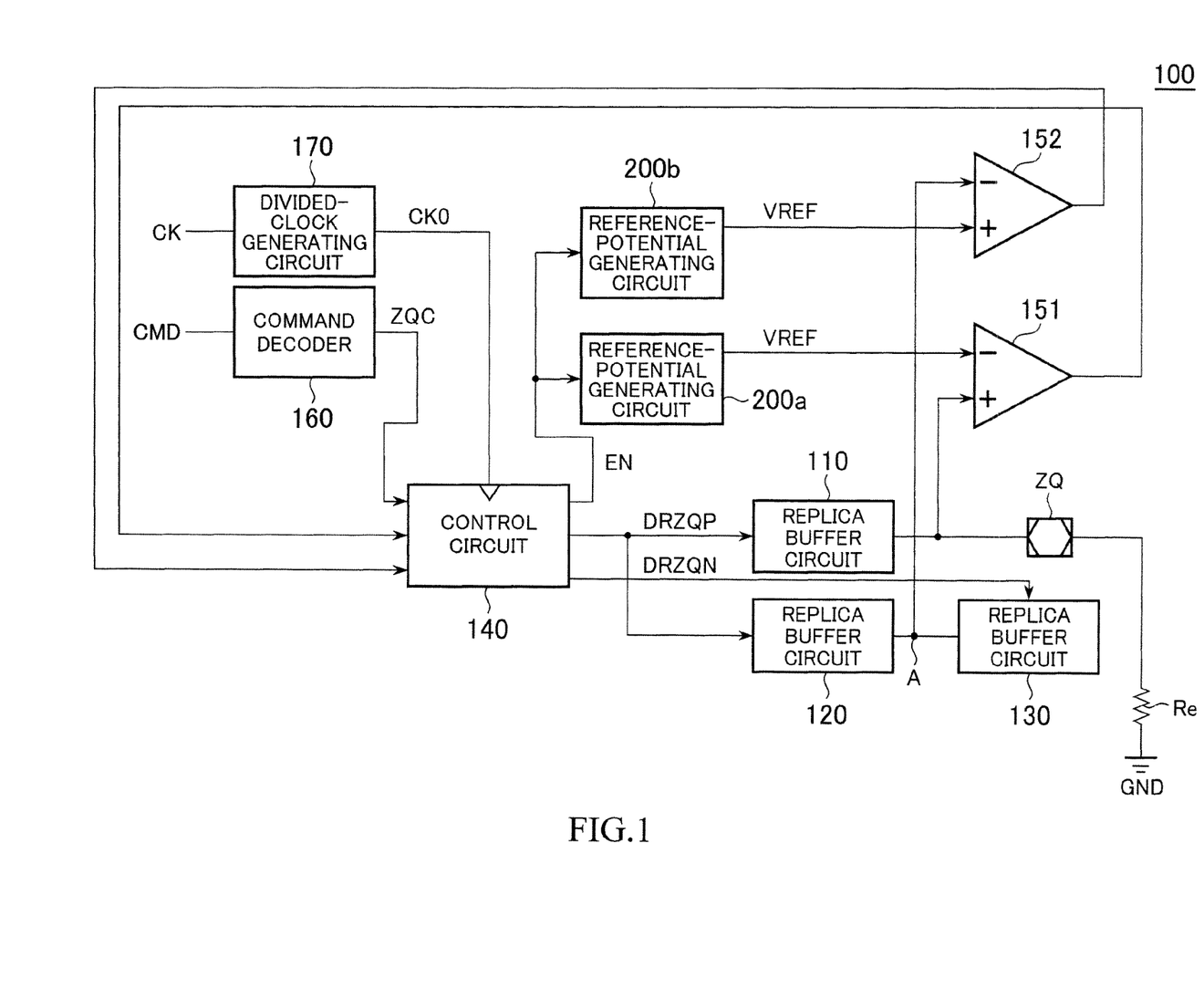
FIG. 1 is a circuit diagram of a calibration circuit 100 according to an embodiment of the present invention.

Referring now to FIG. 1, the calibration circuit 100 according to the present embodiment includes replica buffer circuits 110, 120, and 130, a control circuit 140 that controls impedances of the replica buffer circuits 110, 120, and 130, and comparison circuits 151 and 152 that supply comparison signals COMP1 and COMP2, respectively, to the control circuit 140.

The replica buffer circuits 110, 120, and 130 have a circuit configuration substantially identical to a part of a circuit configuration of an output buffer circuit described later. Adjustment of an output impedance is performed using the replica buffer circuits 110, 120, and 130 and a result of the adjustment is reflected on the output buffer circuit, so that an impedance of the output buffer circuit is adjusted to a desired value. This is the function of the calibration circuit 100.

Figure 2:
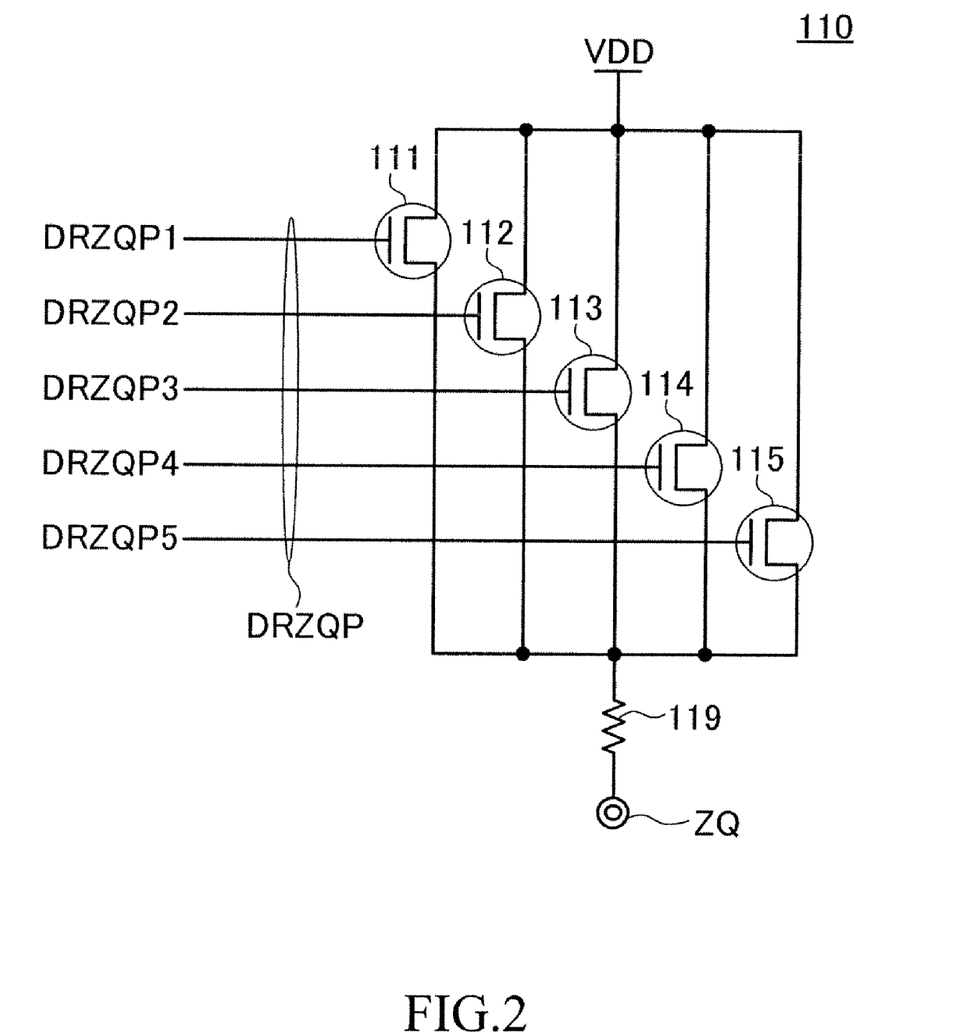
FIG. 2 is a circuit diagram of the replica buffer circuit 110 shown in FIG. 1.

As shown in FIG. 2, the replica buffer circuit 110 includes five P-channel MOS transistors 111 to 115 connected in parallel between a line to which a power-supply potential VDD is supplied and a calibration terminal ZQ. The replica buffer circuit 110 further includes a resistor 119 having an end connected to drains of these transistors 111 to 115 and the other end connected to the calibration terminal ZQ. An external resistor Re is connected to the calibration terminal ZQ as shown in FIG. 1. The external resistor Re has a resistance value being a target of the replica buffer circuits 110, 120, and 130. The replica buffer circuit 110 has only a pull-up function and does not have a pull-down function.

Impedance codes DRZQP1 to DRZQP5 are supplied to gate electrodes of the transistors 111 to 115, respectively, from the control circuit 140. This enables individual ON/OFF control of the five transistors 111 to 115 included in the replica buffer circuit 110. Here, the impedance codes DRZQP1 to DRZQP5 are collectively denoted by DRZQP in FIGS. 1 and 2.

A parallel circuit of the transistors 111 to 115 included in the replica buffer circuit 110 is designed to have a predetermined impedance (120Ω, for example) during conduction. However, an on resistance of a transistor fluctuates based on a manufacturing condition and varies according to an environmental temperature and a power source voltage during an operation. Therefore, a desired impedance is not necessarily obtained. Consequently, to actually set the impedance at 120Ω, the number of transistors to be turned on needs to be adjusted. The parallel circuit including plural transistors is used for this purpose.

To perform impedance adjustment finely as well as in a wide range, it is preferable that W/L ratios (gate width/gate length ratios) of the plural transistors 111 to 115 constituting the parallel circuit are made mutually different. Putting a weight of the power of two is particularly preferable. Considering this point, in the present embodiment, W/L ratios of the transistors 112 to 115 are set at 2WLp, 4WLp, 8WLp, and 16WLp, respectively when a W/L ratio of the transistor 111 is 1WLp.

With this arrangement, the on resistance of the parallel circuit can be fixed at substantially 120Ω regardless of the fluctuation due to a manufacturing condition and a temperature change, by suitably selecting a transistor to be turned on by the pull-up impedance codes DRZQP.

The resistance value of the resistor 119 is designed to set at 120Ω, for example. Accordingly, when the parallel circuit configured by the transistors 111 to 115 becomes in an on state, an impedance of the replica buffer circuit 110 from a viewpoint of the calibration terminal ZQ becomes 240Ω. A tungsten (W) resistor, for example, can be used for the resistor 119.

The replica buffer circuit 120 also has the same circuit configuration as that of the replica buffer circuit 110 shown in FIG. 2 except that the other end of the resistor 119 is connected to a connection node A. Therefore, corresponding bits of the pull-up impedance codes DRZQP1 to DRZQP5 are respectively supplied to gate electrodes of five transistors included in the replica buffer circuit 120.

Figure 3:
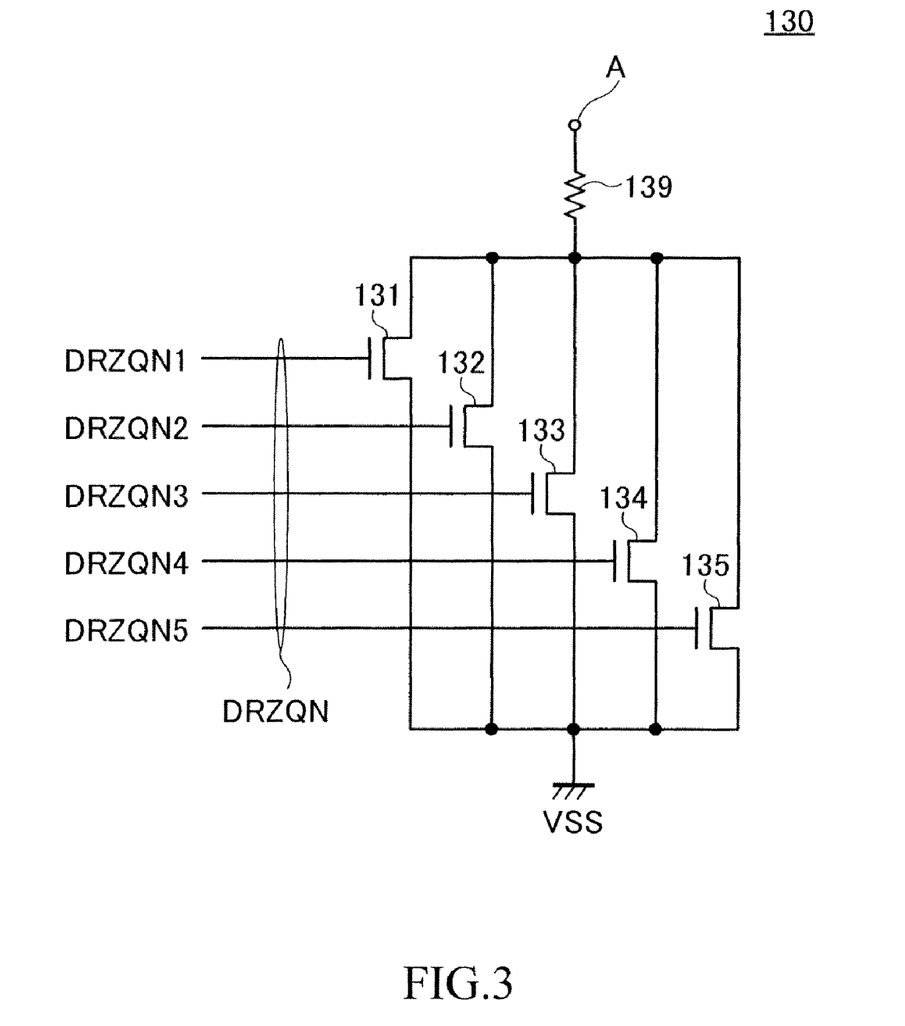
FIG. 3 is a circuit diagram of the replica buffer circuit 130 shown in FIG. 1.

As shown in FIG. 3, the replica buffer circuit 130 includes five N-channel MOS transistors 131 to 135 connected in parallel between a line to which a ground potential VSS is supplied and the connection node A. The replica buffer circuit 130 further includes a resistor 139 having an end connected to drains of these transistors 131 to 135 and the other end connected to the connection node A. The replica buffer circuit 130 has only a pull-down function and does not have a pull-up function.

Impedance codes DRZQN1 to DRZQN5 are supplied to gate electrodes of the transistors to 135, respectively, from the control circuit 140. This enables individual ON/OFF control of the five transistors 131 to 135 included in the replica buffer circuit 130. The impedance codes DRZQN1 to DRZQN5 are collectively denoted by DRZQN in FIGS. 1 and 3.

A parallel circuit of the transistors 131 to 135 included in the replica buffer circuit 130 is also designed to have a resistance value 120Ω, for example, during conduction. The resistance value of the resistor 139 is also designed at 120Ω, for example. Accordingly, when a parallel circuit including the transistors 131 to 135 becomes in an on state, an impedance of the replica buffer circuit 130 from a viewpoint of the connection node A becomes 240Ω similar to the impedances of the replica buffer circuits 110 and 120.

Regarding the transistors 131 to 135, it is also particularly preferable to put a weight of the power of two to their W/L in a similar manner to the W/L of the transistors 111 to 115. Specifically, W/L ratios of the transistors 132 to 135 are set at 2WLn, 4WLn, 8WLn, and 16WLn, respectively when a W/L ratio of the transistor 131 is 1WLn.

Referring back to FIG. 1, a calibration signal ZQC and a divided clock signal CK0 are supplied to the control circuit 140. The calibration signal ZQC is generated by a command decoder 160. The divided clock signal CK0 is generated by a divided-clock generating circuit 170. The command decoder 160 activates the calibration signal ZQC when a command signal CMD supplied from outside of the semiconductor device indicates a calibration command. The divided-clock generating circuit 170 generates the divided clock signal CK0 by dividing an external clock signal CK supplied from outside of the semiconductor device.

When the calibration signal ZQC is activated, the control circuit 140 activates an enable signal EN to a high level and also updates values of the impedance codes DRZQP or DRZQN synchronously with the divided clock signal CK0. Specifically, the impedance codes DRZQP are counted down synchronously with the divided clock signal CK0 when the comparison signal COMP1 output from the comparison circuit 151 is at a high level, and the impedance codes DRZQP are counted up synchronously with the divided clock signal CK0 when the comparison signal COMP1 is at a low level. Furthermore, the impedance codes DRZQN are counted down synchronously with the divided clock signal CK0 when the comparison signal COMP2 output from the comparison circuit 152 is at a high level and the impedance codes DRZQN are counted up synchronously with the divided clock signal CK0 when the comparison signal COMP2 is at a low level.

The comparison circuit 151 has a non-inverting input terminal (+) connected to the calibration terminal ZQ and an inverting input terminal (−) connected to a reference-potential generating circuit 200a. The reference-potential generating circuit 200a generates a reference potential VREF that is intermediate potential between the power-supply potential VDD and the ground potential VSS. With this configuration, the comparison circuit 151 compares a potential of the calibration terminal ZQ and the reference potential VREF with each other, and sets the comparison signal COMP1 at a high level when the former is higher and sets the comparison signal COMP1 at a low level when the latter is higher. Accordingly, when the calibration operation is performed, the potential of the calibration terminal ZQ becomes closer to the reference potential VREF each time the divided clock signal CK0 is activated.

The comparison circuit 152 has an inverting input terminal (−) connected to the connection node A, which is the output end of the replica buffer circuits 120 and 130, and a non-inverting input terminal (+) connected to a reference-potential generating circuit 200b. The reference-potential generating circuit 200b generates the reference potential VREF that is intermediate potential between the power-supply potential VDD and the ground potential VSS, as the reference-potential generating circuit 200a. With this configuration, the comparison circuit 152 compares a potential of the connection node A and the reference potential VREF with each other, and sets the comparison signal COMP2 at a low level when the former is higher and sets the comparison signal COMP2 at a high level when the latter is higher. Accordingly, when the calibration operation is performed, the potential of the connection node A becomes closer to the reference potential VREF each time the divided clock signal CLK0 is activated.

In the present invention, the reference-potential generating circuit 200a and the reference-potential generating circuit 200b can share a circuit. However, when a slight difference in levels is to be produced between the reference potentials VREF supplied to the comparison circuits 151 and 152 considering effects of parasitic resistance between the calibration terminal ZQ and the external resistor Re and the like, it is preferable that the different reference-potential generating circuits 200a and 200b are used for the comparison circuits 151 and 152, respectively, as shown in FIG. 1.

Figure 4:
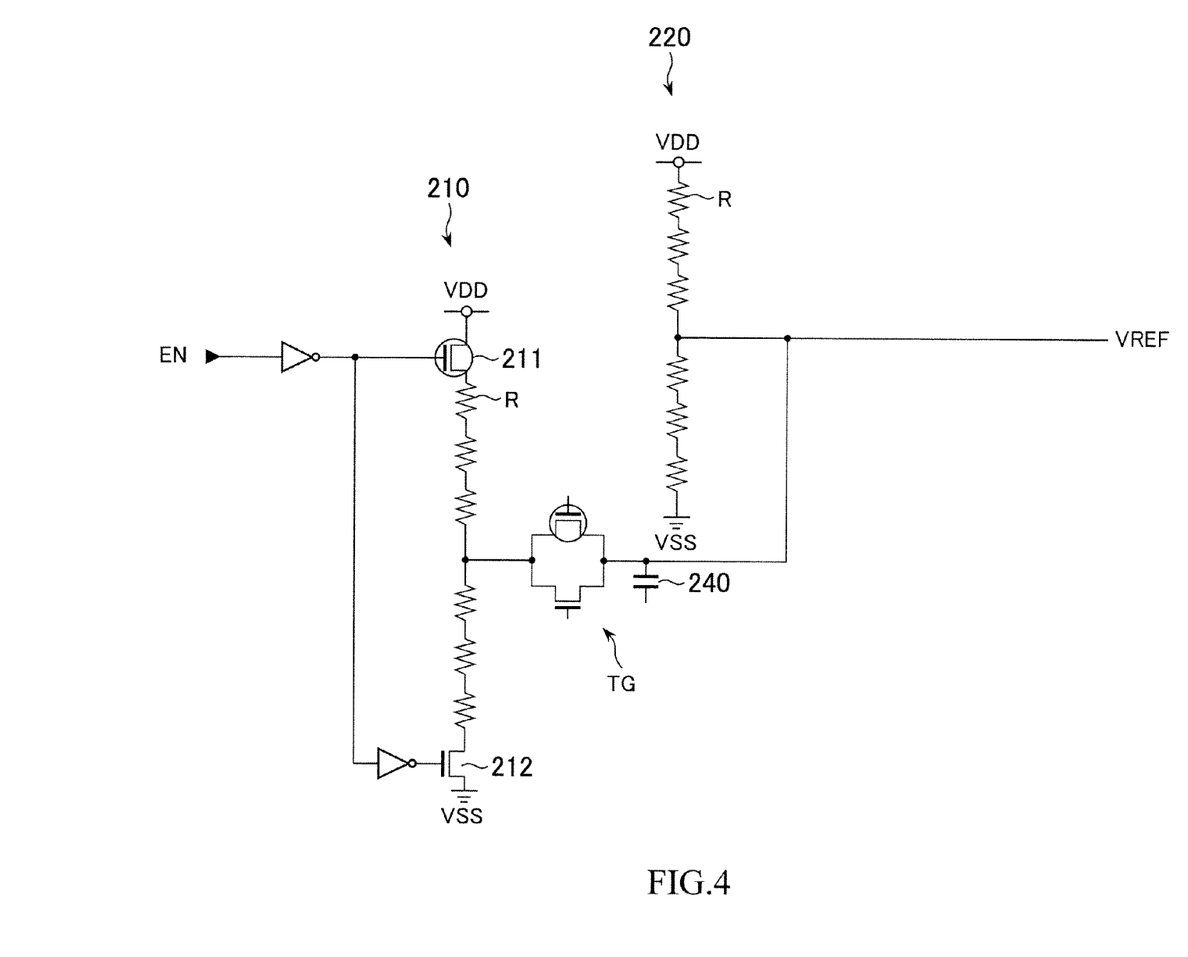
FIG. 4 is a circuit diagram of the reference-potential generating circuits 200a and 200b shown in FIG. 1.

Turning to FIG. 4, because the reference-potential generating circuits 200a and 200b have basically the same circuit configuration, these circuits are collectively referred to as a reference-potential generating circuit 200 in the following explanations.

As shown in FIG. 4, the reference-potential generating circuit 200 has a first potential generating unit 210 activated in response to the enable signal EN, and a second potential generating unit 220 activated regardless of the enable signal EN. The potential generating units 210 and 220 both include a plurality of resistive elements R connected in series between a power-supply line to which the power-supply potential VDD is supplied and a power-supply line to which the ground potential VSS is supplied, and generate the reference potential VREF by resistance-dividing a voltage therebetween. An output node of the potential generating unit 210 is short-circuited to an output node of the potential generating unit 220 through a transfer gate TG. The output nodes of the potential generating units 210 and 220 are connected to a low-pass filter circuit 230. An output potential of the low-pass filter circuit 230 is used as the reference potential VREF and supplied to the comparison circuit 151 or 152. In this way, the output node of the potential generating unit 210 and the output node of the potential generating unit 220 are commonly connected to the comparison circuit 151 or 152 through the low-pass filter circuit 230. A compensation capacitor 240 is connected to an input node of the low-pass filter circuit 230.

The potential generating unit 210 includes a switch element 211 connected in series between the power-supply line to which the power-supply potential VDD is supplied and the resistive elements R, and a switch element 212 connected in series between the power-supply line to which the ground potential VSS is supplied and the resistive elements R. In the present embodiment, the switch element 211 includes a P-channel MOS transistor and the switch element 212 includes an N-channel MOS transistor. The transistor included in the switch element 211 has a gate electrode to which an inverted enable signal EN is supplied, and the transistor included in the switch element 212 has a gate electrode to which the enable signal EN not to be inverted is supplied.

With this configuration, the reference potential VREF is generated by both of the potential generating units 210 and 220 when the enable signal EN is activated to a high level, and the reference potential VREF is generated only by the potential generating unit 220 when the enable signal EN is deactivated to a low level. A series circuit that constitutes the potential generating unit 210 has a resistance value designed to be relatively low so as to stably supply the reference potential VREF to the comparison circuits 151 and 152 during the calibration operation. On the other hand, a series circuit that constitutes the potential generating unit 220 has a resistance value designed to be relatively high to sufficiently suppress a consumption current. In other words, a current flowing in the potential generating unit 220 is sufficiently smaller than that flowing in the potential generating unit 210 during activation.

Accordingly, the reference potential VREF can be stably supplied to the comparison circuits 151 and 152 by activation of the enable signal EN during a period when the calibration operation is performed, and the level of the reference potential VREF can be kept by the potential generating unit 220 having a smaller current consumption during a period when the calibration operation is not performed. Therefore, the comparison operations by the comparison circuits 151 and 152 can be started immediately after activation of the calibration signal ZQC. When the enable signal EN is activated, the level of the reference potential VREF may transiently fluctuate because the output of the reference potential VREF is started by the potential generating unit 210 having been in a high-impedance state. However, this fluctuation is blocked by the low-pass filter circuit 230. Furthermore, because the reference-potential generating circuit 200 outputs the reference potential VREF regardless of the enable signal EN in the present embodiment, capacitance values of a capacitor included in the low-pass filter circuit 230 and the compensation capacitor 240 can be increased, which also contributes to the stabilization of the reference potential VREF.

The configuration of the calibration circuit 100 according to the present embodiment is as described above.

Figure 5:
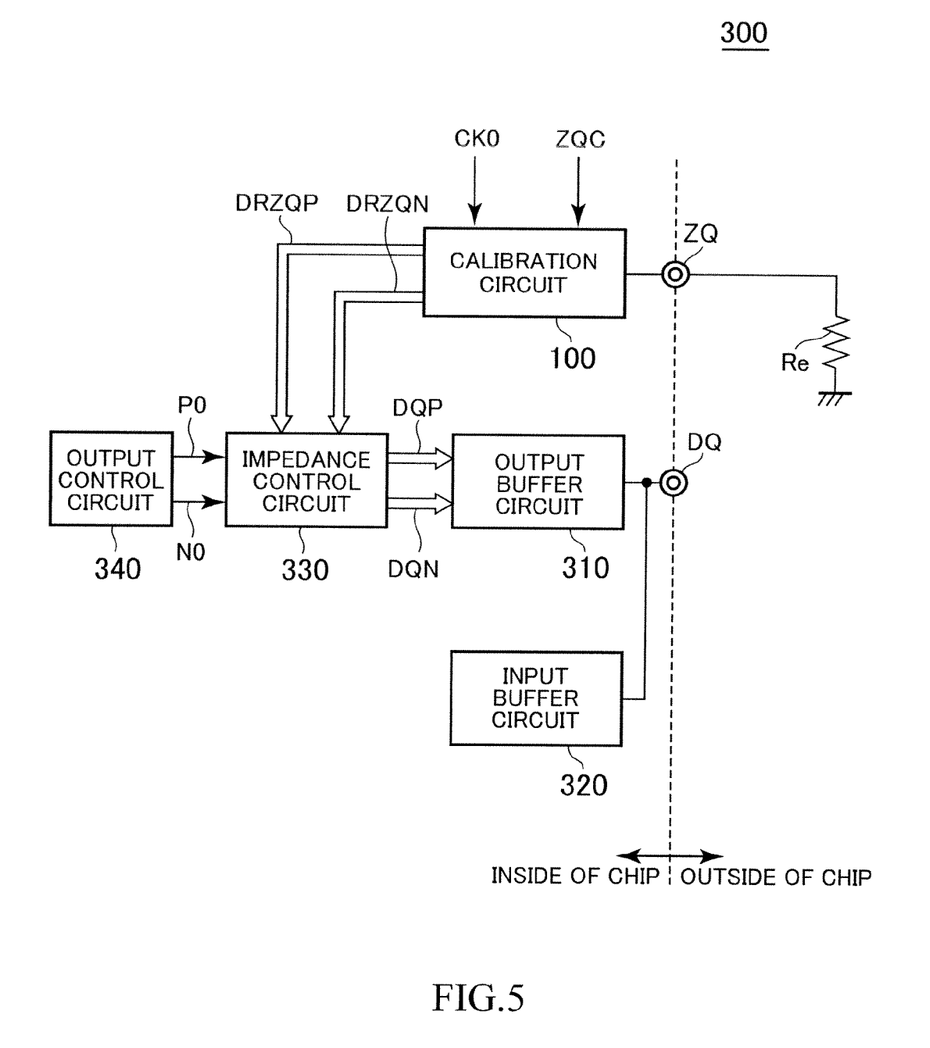
FIG. 5 is a block diagram showing main parts of a semiconductor device 300 including the calibration circuit 100.

Turning to FIG. 5, the semiconductor device 300 includes an output buffer circuit 310 and an input buffer circuit 320 connected to a data input/output terminal DQ, in addition to the calibration circuit 100. As for the configuration of the input buffer circuit 320, because it is not directly relevant to the scope of the present invention, explanations thereof will be omitted in the present specification.

An operation of the output buffer circuit 310 is controlled by operation signals DQP and DQN supplied from an impedance control circuit 330. As shown in FIG. 5, the impedance codes DRZQP and DRZQN supplied from the calibration circuit 100 are supplied to the impedance control circuit 330.

Figure 6:
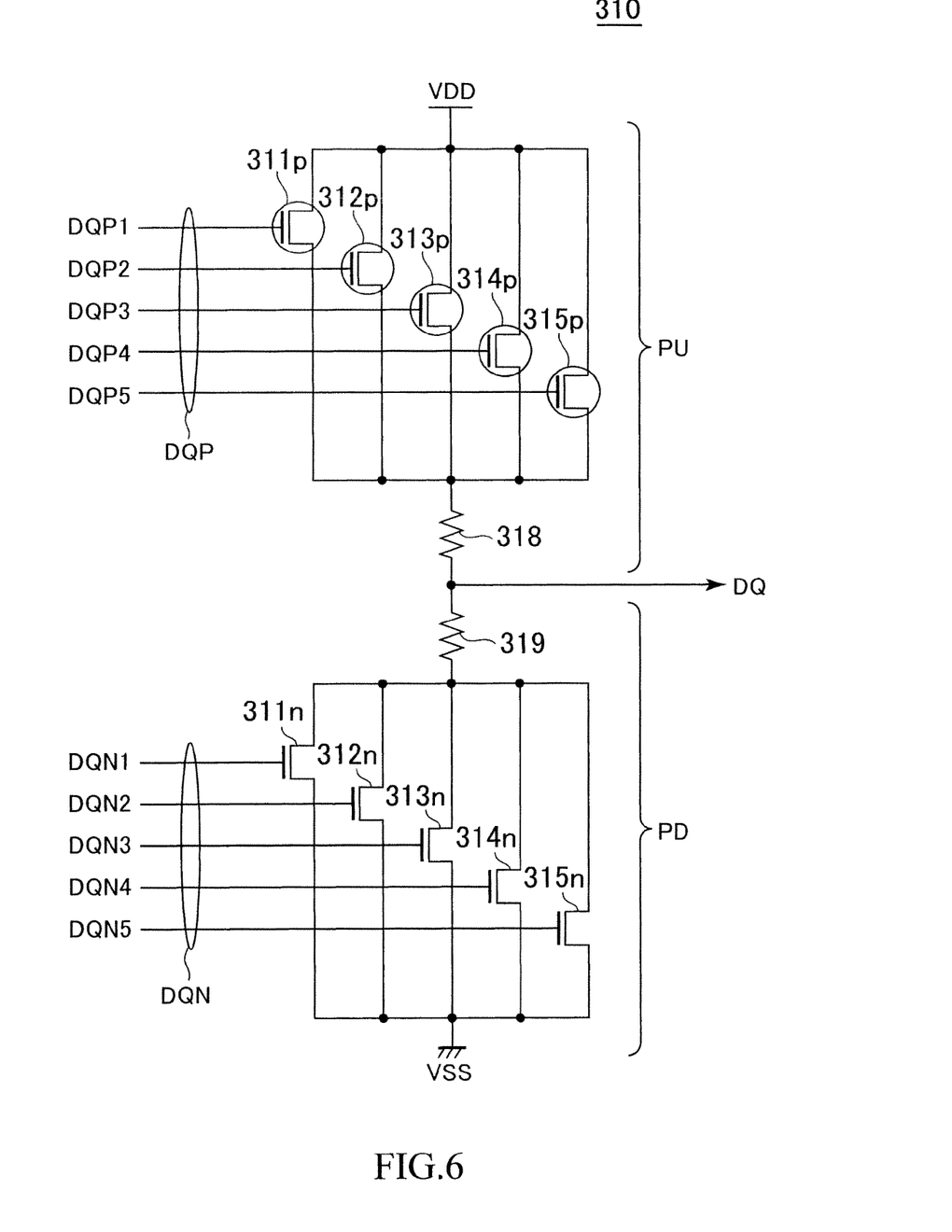
FIG. 6 is a circuit diagram of the output buffer circuit 310 shown in FIG. 5.

As shown in FIG. 6, the output buffer circuit 310 includes five P-channel MOS transistors 311p to 315p connected in parallel and five N-channel MOS transistors 311n to 315n connected in parallel. Resistors 318 and 319 are connected in series between the transistors 311p to 315p and the transistors 311n to 315n. A connection point between the resistors 318 and 319 is connected to the data input/output terminal DQ.

Five operation signals DQP1 to DQP5 constituting an operation signal DQP are supplied to gate electrodes of the transistors 311p to 315p, respectively. Further, five operation signals DQN1 to DQN5 constituting an operation signal DQN are supplied to gate electrodes of the transistors 311n to 315n, respectively. Accordingly, the ten transistors included in the output buffer circuit 310 are individually ON/OFF-controlled by the ten operation signals DQP1 to DQP5 and DQN1 to DQN5. The operation signals DQP1 to DQP5 are a signal group constituting the operation signal DQP and the operation signals DQN1 to DQN5 are a signal group constituting the operation signal DQN.

In the output buffer circuit 310, a pull-up circuit PU including the P-channel MOS transistors 311p to 315p and the resistor 318 has substantially the same circuit configuration as that of the replica buffer circuit 110 (or 120) shown in FIG. 2. A pull-down circuit PD including the N-channel MOS transistors 311n to 315n and the resistor 319 has substantially the same circuit configuration as that of the replica buffer circuit 130 shown in FIG. 3.

Therefore, a parallel circuit including the transistors 311p to 315p and a parallel circuit including the transistors 311n to 315n are both designed to become 120Ω, for example, at the time of conduction. Furthermore, resistance values of the resistors 318 and 319 are both designed at 120Ω, for example. Accordingly, when one of the parallel circuit including the transistors 311p to 315p and the parallel circuit including the transistors 311n to 315n becomes an ON state, an impedance of the output buffer circuit viewed from the data input/output terminal DQ becomes 240Ω.

In a practical semiconductor device, a plurality of the output buffer circuit 310 are provided in parallel so that an output impedance can be selected based on the number of output buffer circuits to be used. That is, when an impedance of one output buffer circuit is X, the output impedance can be set to X/n by using n output buffer circuits in parallel.

Figure 7:
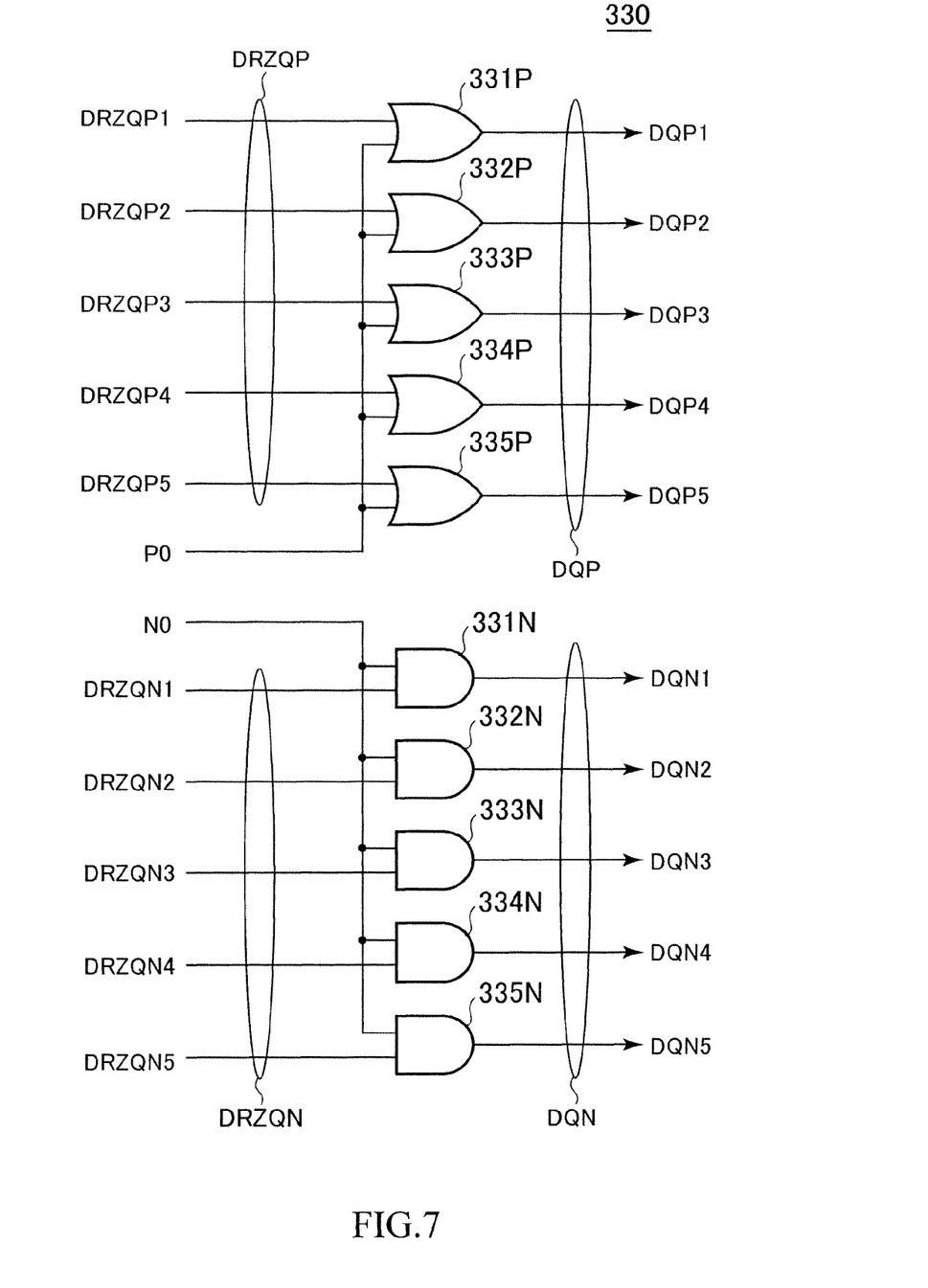
FIG. 7 is a circuit diagram of the impedance control circuit 330 shown in FIG. 5.

As shown in FIG. 7, the impedance control circuit 330 includes five OR gate circuits 331P to 335P and five AND gate circuits 331N to 335N. To the OR gate circuits 331P to 335P, a selection signal P0 from an output control circuit 340 is supplied in common and the impedance codes DRZQP1 to DRZQP5 from the calibration circuit 100 are supplied, respectively. Meanwhile, to the AND gate circuits 311N to 315N, a selection signal N0 from the output control circuit 340 is supplied in common and the impedance codes DRZQN1 to DRZQN5 from the calibration circuit 100 are supplied, respectively.

The selection signals P0 and N0 supplied from the output control circuit 340 are controlled according to logical values of data to be output from the data input/output terminal DQ and the like. Specifically, the selection signals P0 and N0 are set to a low level when a high level signal is to be output from the data input/output terminal DQ, and the selection signals P0 and N0 are set to a high level when a low level signal is output from the data input/output terminal DQ. When an ODT (On Die Termination) function to use the output buffer circuit 310 as a termination resistor is employed, the selection signal P0 is set to a low level and the selection signal N0 is set to a high level.

The operation signals DQP1 to DQP5 (=DQP) output from the OR gate circuits 331P to 335P and the operation signals DQN1 to DQN5 (=DQN) output from the AND gate circuits 331N to 335N are supplied to the output buffer circuit 310 as shown in FIG. 5.

This is the configuration of the semiconductor device 300. With this configuration, the impedance codes DRZQP and DRZQN generated by the calibration circuit 100 are reflected on the output buffer circuit 310, which enables the impedance of the output buffer circuit 310 to be adjusted to a desired value. Further, in the present embodiment, the two potential generating units 210 and 220 are included in each of the reference-potential generating circuits 200a and 200b and the potential generating unit 210 having a higher driving performance is activated during the calibration operation while the potential generating unit 220 having a lower driving performance is constantly activated. Accordingly, an accurate calibration operation can be achieved while suppressing the power consumption.

It is apparent that the present invention is not limited to the above embodiments, but may be modified and changed without departing from the scope and spirit of the invention.

For example, the size of the transistors included in the replica buffer circuits 110, 120, and 130 does not need to be the same as that of the transistors included in the output buffer circuit 310. Shrunk transistors can be used as long as the transistors have substantially the same impedance.

While the parallel circuit including five transistors is used as the parallel circuit that constitutes the output buffer circuit or the replica buffer circuits in the present embodiment, the number of transistors connected in parallel is not limited to five.

What is claimed:

1. A semiconductor device comprising:
a calibration terminal;
a replica buffer circuit that drives the calibration terminal;
a reference-potential generating circuit that generates a reference potential;
a comparison circuit that compares a potential appearing at the calibration terminal with the reference potential to generate a comparison result signal; and
a control circuit that controls an output impedance of the replica buffer circuit based on the comparison result signal,
wherein the reference-potential generating circuit includes a first potential generating unit activated in response to an enable signal and a second potential generating unit activated regardless of the enable signal, and an output node of the first potential generating unit and an output node of the second potential generating unit are commonly coupled to the comparison circuit.

2. The semiconductor device as claimed in claim 1, wherein the second potential generating unit flows smaller current than the first potential generating unit when activated.

3. The semiconductor device as claimed in claim 1, wherein the reference-potential generating circuit further includes a low-pass filter circuit connected to the output nodes of the first and second potential generating units.

4. The semiconductor device as claimed in claim 1, wherein each of the first and second potential generating units includes a plurality of resistive elements connected in series between a first power-supply line and a second power-supply line.

5. The semiconductor device as claimed in claim 4, wherein the first potential generating unit further includes a switch element connected in series to the resistive elements, and the enable signal is supplied to a control node of the switch element.

6. The semiconductor device as claimed in claim 1, wherein the replica buffer circuit has one of a pull-up function and a pull-down function.

7. The semiconductor device as claimed in claim 1, further comprising a data terminal, and an output buffer circuit that drives the data terminal,
wherein at least a part of the output buffer circuit has substantially a same circuit configuration as that of the replica buffer circuit.

8. The semiconductor device as claimed in claim 7, wherein an output impedance of the output buffer circuit is adjusted by the control circuit.

9. A semiconductor device comprising:
a first potential generating unit that outputs a first potential at a first output node thereof when an enable signal is in a first logic level, the first potential generating unit bringing the first output node into a high-impedance state when an enable signal is in a second logic level different from the first logic level;

a second potential generating unit that outputs the first potential at a second output node thereof when at least the enable signal is in the second logic level;

a connection line that electrically connects the first and second output nodes; and a comparison circuit that compares the first potential appearing at the connection line with a second potential.

10. The semiconductor device as claimed in claim 9, further comprising a calibration terminal and a buffer circuit that drives the calibration terminal so that the second potential appears at the calibration terminal, wherein the comparison circuit compares the first potential appearing at the connection line with the second potential appears at the calibration terminal to generate a comparison result signal, and the buffer circuit is controlled by the comparison result signal.

11. The semiconductor device as claimed in claim 9, wherein the second potential generating unit outputs the first potential at the second output node regardless of a logic level of the enable signal.

12. The semiconductor device as claimed in claim 11, wherein the second potential generating unit flows smaller current than the first potential generating unit when the enable signal is in the first logic level.

* * * * *